US006180951B1

(12) United States Patent
Joehnk et al.

(10) Patent No.: US 6,180,951 B1

(45) Date of Patent: Jan. 30, 2001

(54) PROCESS FOR IRRADIATION PRODUCING CONSTANT DEPTH/DOSE PROFILE

(75) Inventors: Edward J. Joehnk, Walnut Creek; Sergio E. Bravo, Alamo, both of CA (US)

(73) Assignee: Nutek Corporation, Hayward, CA (US)

(*) Notice: Under 35 U.S.C. 154(b), the term of this patent shall be extended for 0 days.

(21) Appl. No.: 09/369,554

(22) Filed: Aug. 6, 1999

(51) Int. Cl.[7] .............................. G21K 5/00; H01J 37/02

(52) U.S. Cl. .................................. 250/492.1; 250/492.3; 378/69

(58) Field of Search ............................ 250/492.3, 492.1; 378/69

(56) References Cited

U.S. PATENT DOCUMENTS

| | | | |
|---|---|---|---|
| 3,683,179 | 8/1972 | Norman | 250/49.5 |
| 3,683,181 | 8/1972 | Packin et al. | 250/52 |
| 3,833,814 | 9/1974 | Nablo | 250/492 |
| 3,925,671 | 12/1975 | Austin et al. | 250/400 |
| 4,029,967 * | 6/1977 | Tetzlaff | 378/69 |
| 4,121,086 | 10/1978 | Auslender et al. | 219/121 |
| 4,226,687 | 10/1980 | Sasaki et al. | 204/159.13 |
| 4,689,488 | 8/1987 | Beziers | 250/492.3 |
| 4,983,849 * | 1/1991 | Thompson et al. | 250/492.3 |
| 5,311,027 | 5/1994 | Schuetz | 250/492.3 |

OTHER PUBLICATIONS

Barnard, J., "E–Beam Processing in the Medical Device Industry," Sterilization Update, Medical Device Technology, pp. 34–41, (1991).

Norris, R.E., et al., "Selection of Materials to be Utilized in Fabrication Tooling for Electron–Beam Curing of Composites", 28th International SAMPE Technical Conference, vol. 28, Society for the Advancement of Material and Process Engineering, pp. 890–894 (1996).

Diehl, J.F., "Safety of Irradiated Foods", Second Ed., Revised and Expanded, Marcel Dekker, Inc., pp. 29–42 (1995).

ISO, "Dosimetry in an electron–beam facility for radiation processing at energies between 300 keV and 25 MeV", Draft International Standard, ISO/DIS 15569, pp. 1–19 (1997).

McIntyre, R. et al., "Applications of EGS4 to Industrial Irradiator Design and Use", Radiation Processing: State of the Art, vol. II, Radiat. Phys. Chem. vol. 35, Nos. 4–6, pp. 762–766 (1989).

* cited by examiner

*Primary Examiner*—Jack Berman

(74) *Attorney, Agent, or Firm*—Townsend and Townsend and Crew LLP

(57) ABSTRACT

Irradiation of a target material disposed around a reel rotated about an axis perpendicular to the sweep of a beam of radiation produces a linear relationship between the depth into the target material and the radiation dose received. Where the core of the reel is sufficiently transparent to the radiation beam, target material located on the backside of the reel is also irradiated, creating a constant relationship between depth into the target material and the radiation dose received. The depth/dose profile can be tuned to a constant value by varying parameters of the irradiation process, such as target material thickness, target material density, reel diameter, and energy of the applied beam of radiation.

29 Claims, 14 Drawing Sheets

PROCESS FOR IRRADIATION PRODUCING CONSTANT DEPTH/DOSE PROFILE

BACKGROUND OF THE INVENTION

1. Field of the Invention

The present invention relates to a process for irradiating a target material, and in particular, to a process for irradiation producing a constant dose of radiation at various depths within the irradiated material.

2. Description of the Related Art

Controlled irradiation of target materials is a mature technology having many industrial applications. Important uses for irradiation include lithography in the fabrication of semiconductor devices, high-power magnification and imaging in the form of electron microscopy, cross-linking of polymeric materials, and sterilization of medical devices and foodstuffs.

Each of these applications involve the generation of radiation from a source, followed by direction of this radiation to a target material. Emission of a variety of forms of radiation is commonly utilized, including electron beam, x-ray, and gamma radiation.

Conventional irradiation processes suffer from an important disadvantage in that the dose of radiation delivered to an irradiated object varies over the thickness of the target material.

FIG. 1 shows a typical depth/dose profile resulting from exposing a target material to conventional electron beam irradiation. FIG. 1 shows that the relationship between radiation dose and material depth is nonlinear. For example, the radiation dose is lower at the surface of the target material than at a depth X into the target material. In a conventional method of electron beam irradiation, the peak subsurface irradiation dose can be as much as 30–50% greater than the surface dose.

While FIG. 1 depicts the depth/dose profile for electron beam irradiation, both x-ray and gamma radiation also exhibit a profile similar to that shown in FIG. 1.

For electron beam irradiation, the non-linear character of the curve shown in FIG. 1 is attributable to the impact of high energy radiated electrons with low energy local electrons present in target surface regions. The initial impact of these high energy electrons with local surface electrons imparts energy to the local electrons, which then penetrate more deeply. The penetrating electrons in turn collide with local electrons positioned even more deeply within the target, displacing them further into the target material.

As a result of this chain reaction, the impact of high energy electrons at the surface results in the shifting of maximum radiation concentrations to subsurface regions. However, below a depth X' in the target material, energy imparted to the target material becomes sufficiently diffused that local electrons no longer possess sufficient energy to penetrate further, and the radiation dose tails off.

This nonlinear relationship between radiation dose and target material depth creates a number of problems. One problem is lack of predictability. Because of the nonlinear depth/dose relationship, in order to anticipate the expected radiation dosage engineers must resort to statistical computer programs utilizing Monte Carlo approximations. These approximations are complex, time consuming, and costly.

Therefore, there is a need in the art for a method of irradiation that provides a linear relationship between electron dose and the thickness of the irradiated material.

An even more important problem with conventional irradiation techniques is that subsurface regions can be expected to receive heavier doses of radiation than surface regions. For example, where electron beams are applied to trigger polymerization and cross-linking, the dose profile shown in FIG. 1 can lead to an uneven degree of polymerization and hardness at different depths within the material. This nonuniformity of cross-linking can create quality control and other problems. Similarly, where electron beams are applied to sterilize a material, variation of dose with depth can lead to nonuniform sterilization and the possibility of infection and other problems.

In theory, the problem of variation in radiation dosing can be overcome by applying such intense radiation that even surface material regions receive sufficiently high doses. In practice however, this approach can cause a host of problems associated with over-irradiation of the subsurface regions.

Perhaps most significantly, subsurface regions receiving heavier doses of radiation can begin to degrade. Moreover, accumulated heat from the over-irradiation can also affect temperature-sensitive target materials such as plastics or foodstuffs. In addition to problems with degradation and heat, excess electron beam irradiation needlessly consumes large amounts of power and imposes strain on expensive and difficult-to-maintain irradiation equipment.

Therefore, there also is a need in the art for a method of electron beam irradiation that produces a relatively constant dose of electrons from target surface regions to subsurface target regions.

SUMMARY OF THE INVENTION

The present invention relates to a process for irradiation which results in a linear and substantially constant relationship between radiation dose and irradiated target material depth. Specifically, where a target material is disposed on a reel rotated about an axis perpendicular to the direction of sweep of a beam of radiation, the relationship between dose and material depth becomes linear. Moreover, by making the core of the rotating reel substantially transparent to the radiation, portions of the target material on the backside of the reel are also irradiated, producing a constant depth/dose profile. By varying certain irradiation parameters, a constant relationship between radiation dose and material depth can be achieved.

A process for irradiating a target material in accordance with one embodiment of the present invention comprises the steps of providing a beam of radiation having an energy and a direction of scan sweep, and providing a reel having a center axis, the reel including a core substantially transparent to the beam of radiation. A target material having a thickness is disposed around the reel. The reel is rotated around the center axis, and the beam is directed at the target material such that the direction of scan sweep is substantially perpendicular to the center axis, whereby the beam of radiation encounters the target material on a frontside of the reel, passes through the core, and reencounters target material on a backside of the reel, such that the target material receives a substantially constant dose of radiation throughout its thickness.

A method of optimizing an irradiation process in which a target material is rotated on a core substantially transparent to a beam of radiation in accordance with one embodiment of the present invention, comprises the steps of maintaining constant an energy of the radiation beam, a density of the target material, and a diameter of the core, and then varying a thickness of the target material to produce a substantially constant dose of radiation throughout the thickness of the target material.

The features and advantages of the present invention will be understood upon consideration of the following detailed description of the invention and the accompanying drawings.

DETAILED DESCRIPTION

The present invention relates to a method of electron beam irradiation which produces a substantially constant dose of electrons throughout the thickness of an irradiated target material.

Figure 2:
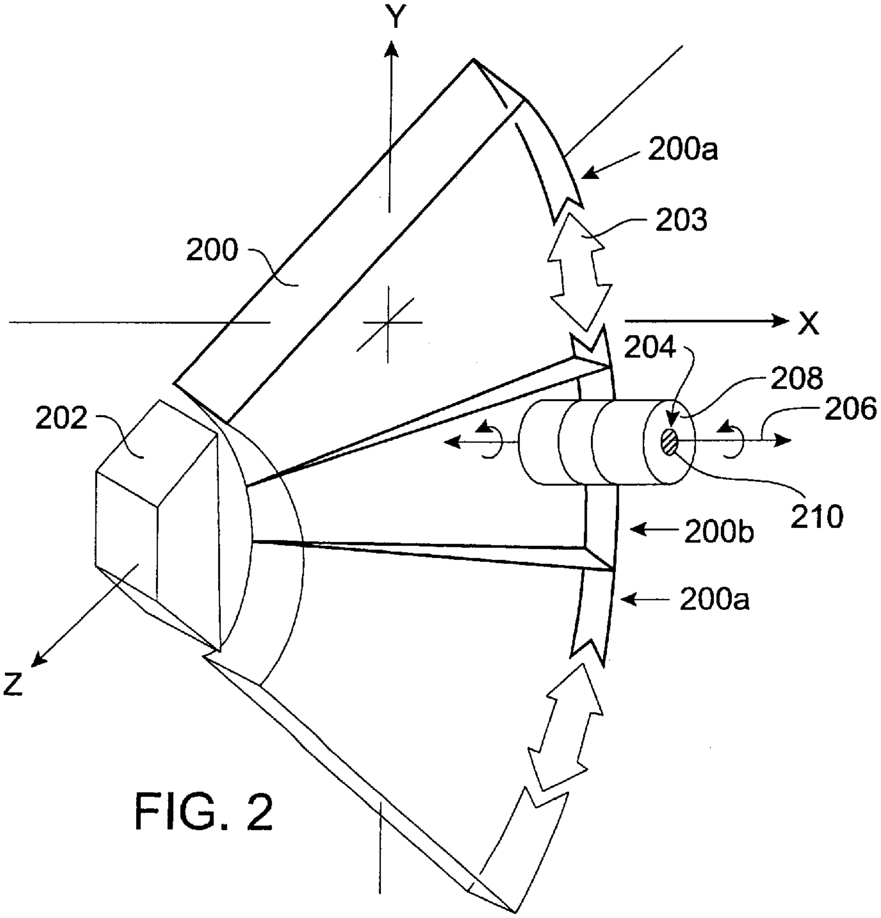
FIG. 2 shows a cross sectional view of an apparatus for performing electron beam irradiation in accordance with one embodiment of the present invention.

FIG. 2 shows a perspective view of an apparatus for performing electron beam irradiation configuration in accordance with one embodiment of the present invention. Electron beam 200 is emitted from scan horn 202, with a direction of sweep 203 along the Y-axis as indicated. Because of intrinsic physical properties of the irradiation apparatus, emitted electrons at periphery 200*a* of the beam sweep have less energy than emitted electrons present at center 200*b* of the beam sweep.

Cylindrical reel 204 is positioned within electron beam 200, and is rotated around center axis 206. Center axis 206 is oriented along the X-axis, perpendicular to the direction of the beam sweep of scan horn 202. As a result of this orthogonal orientation of beam sweep relative to axis of rotation 206, frontside of reel 204 receives only emitted electrons at center 200*b* of the beam sweep.

Target material 208 is disposed around reel 204. Core 210 of reel 204 possesses sufficient density that electron beam 200 does not pass through.

Figure 3:
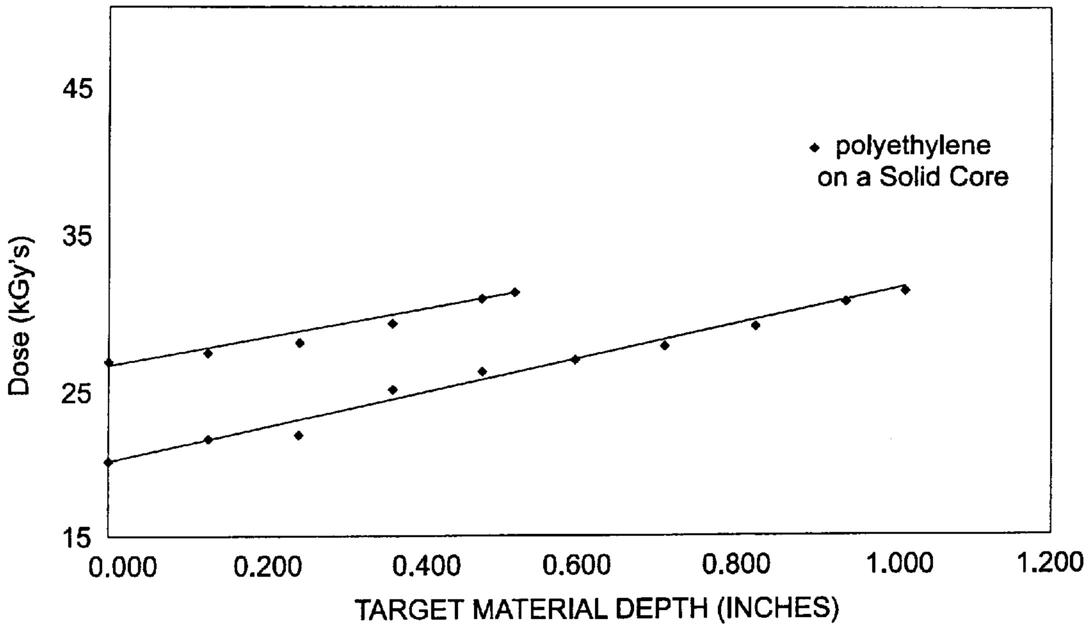
FIG. 3 shows depth/dose profiles of electron beam irradiation of polyethylene material disposed around a rotating reel having a solid core.

FIG. 3 shows a depth/dose profile of electron beam irradiation of two thicknesses (0.5" and 1") of polyethylene material disposed around a rotating reel as shown in FIG. 2. Inspection of FIG. 3 reveals that for both material thicknesses, a linear depth/dose profile is produced, with surface regions receiving a lesser dose than subsurface regions. The linear depth/dose profile shown in FIG. 3 contrasts markedly with the non-linear depth/dose profile shown in FIG. 1 resulting from conventional irradiation techniques.

It has also been discovered that where the dense core of the reel is replaced with a less-dense core which permits electrons of the beam to pass and thereby irradiate target material on the backside of the reel, a constant depth/dose profile may be achieved.

Figure 4:
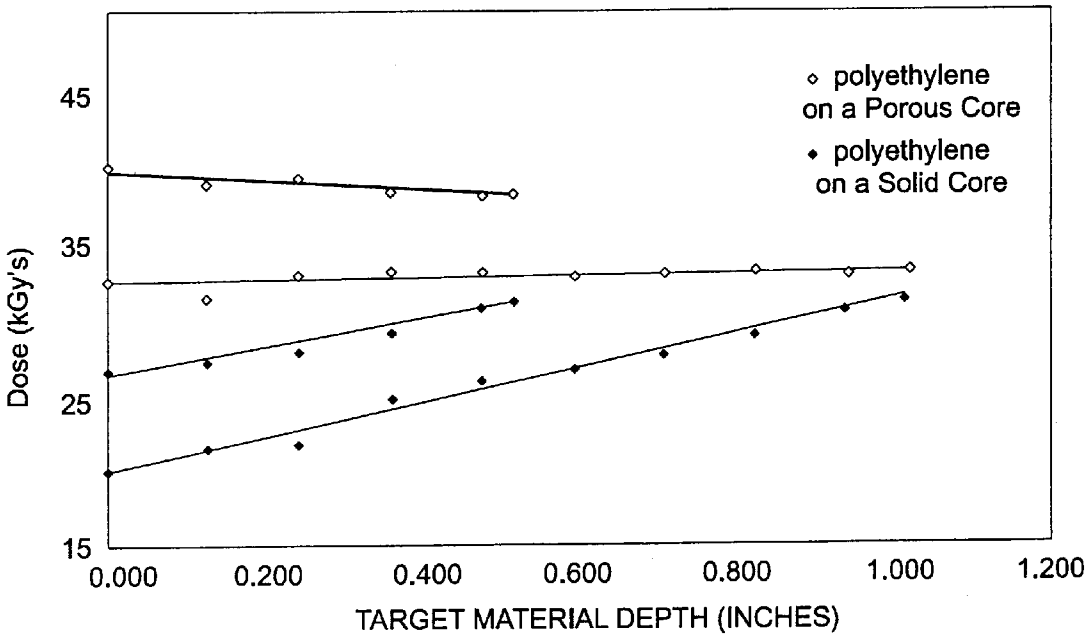
FIG. 4 plots depth/dose profiles of electron beam irradiation of polyethylene material disposed around a rotating reel having a low density core.

FIG. 4 compares the depth/dose profiles resulting from irradiation of polyethylene material disposed around reels having a solid core and a core of lower density. Inspection of FIG. 4 reveals that for reels having either types of core, a substantially constant depth/dose profile was observed. Moreover, with the less dense (porous) core, a substantially constant depth/dose profile was observed. Thus, surface regions received approximately the same dose as subsurface regions. This result is central to the present invention, and is now examined in detail.

Figure 5:
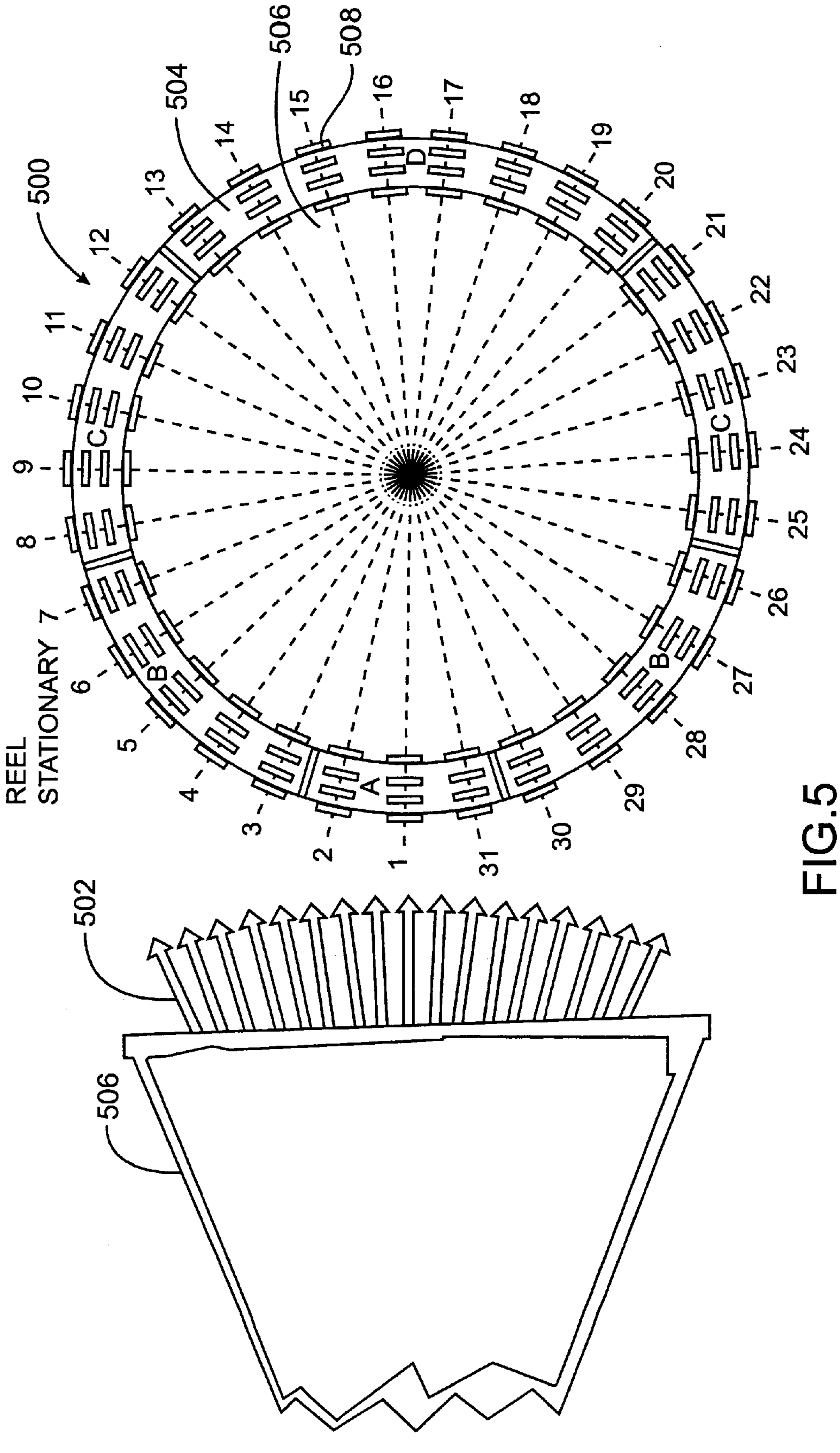
FIG. 5 shows a cross-sectional view of a reel positioned in a beam of electron radiation.

FIG. 5 shows a cross-sectional view of a reel 500 positioned in beam 502 of electron radiation. Target material 504 is disposed around reel core 506 having a diameter. Electron beam 502 is emitted from scan horn 506. The relative size of scan horn 506 and reel 500 are not shown to scale in FIG. 5.

Unlike the reel shown in FIG. 2, core 506 of reel 500 is of a sufficiently low density that the electrons from beam 502 pass through target material 504 disposed on the frontside of reel 500, pass through core 506, and then further irradiate target material 504 disposed on the backside of reel 500.

Dosimeters 508 are positioned at four depths of target material 504 (at the surface, ⅔ off of the core, ⅓ off of the core, and at the core) at each of sites 1–31. Measurement of the dose resulting from this irradiation reveals four general regions of dosing. These regions, labeled A–D, are listed below in order of decreasing electron dose received:

TABLE 1

REGIONS OF DOSING OF TARGET MATERIAL POSITIONED ON STATIONARY REEL

| REGION | SITE NOS. |
| --- | --- |
| Region A | 1, 2, 31 |
| Region B | 3–7; 26–30 |
| Region C | 8–12; 21–25 |
| Region D | 13–20 |

FIGS. 6A–6D plot the effect upon the depth/dose profile of material of different thicknesses positioned on a stationary reel as shown in FIG. 5.

Figure 1:
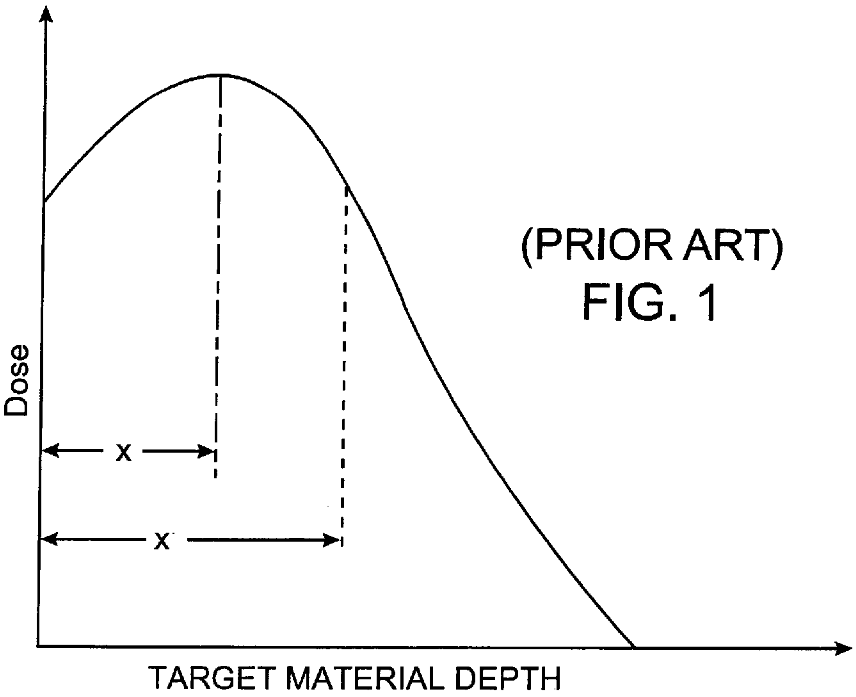
(PRIOR ART) FIG. 1
FIG. 1 shows a depth/dose profile resulting from conventional electron beam irradiation.
Figure 6A:
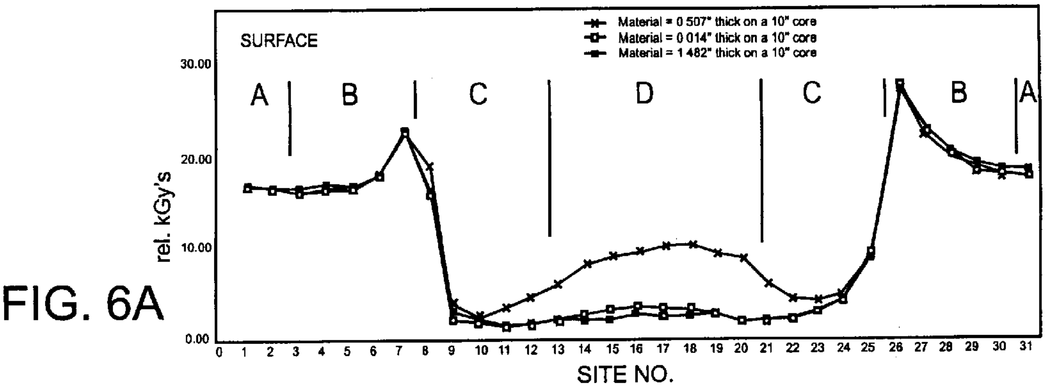
FIGS. 6A–6D plot the depth/dose profile of polyethylene material of different thicknesses disposed on the stationary reel of FIG. 5.
Figure 6B:
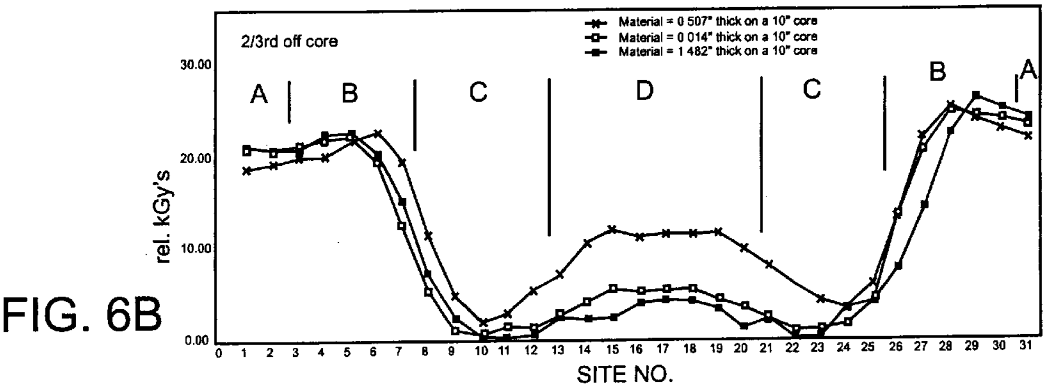
Figure 6C:
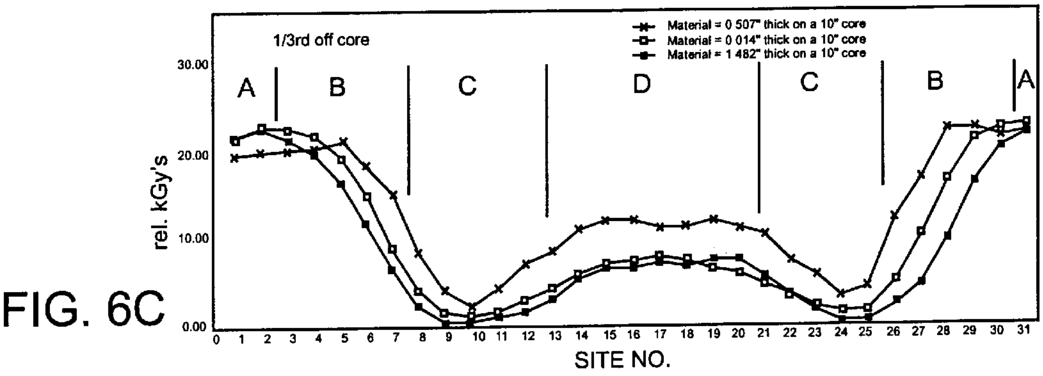
Figure 6D:
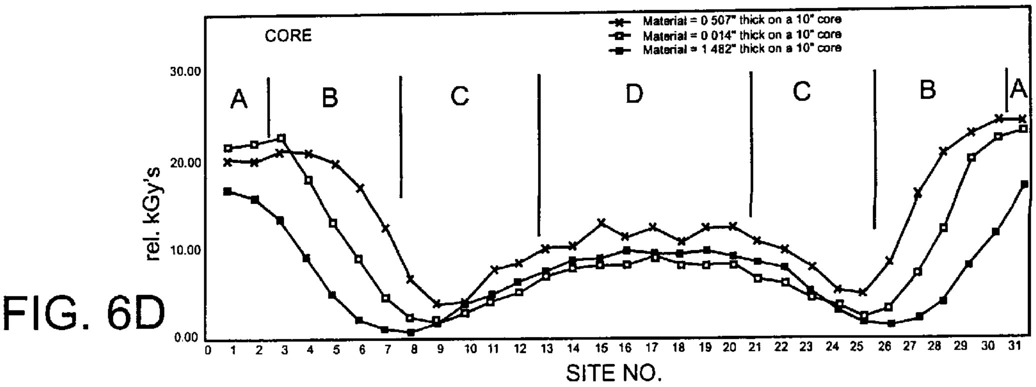
Figure 7A:
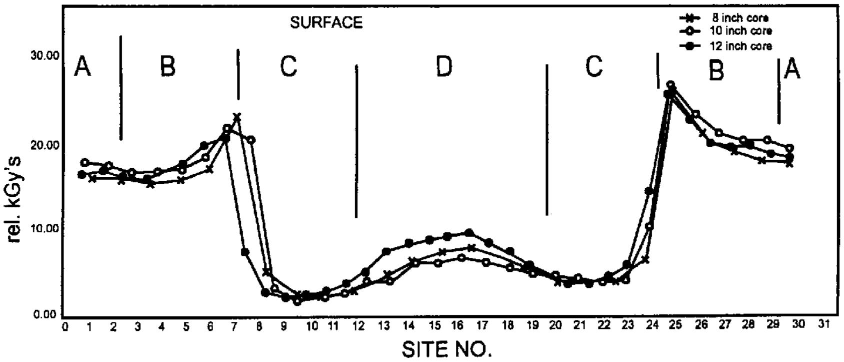
FIGS. 7A–7D plot the depth/dose profile of polyethylene material disposed on stationary reels of FIG. 5 having different core diameters.
Figure 7B:
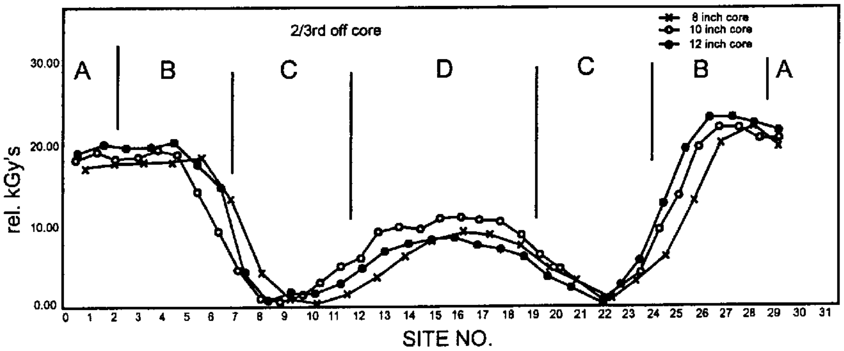
Figure 7C:
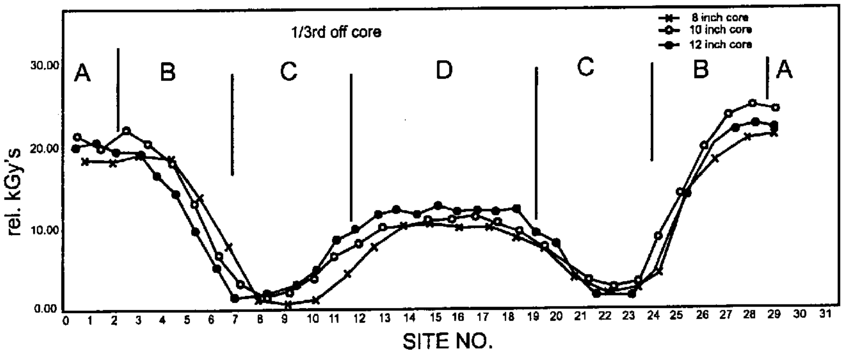
Figure 7D:
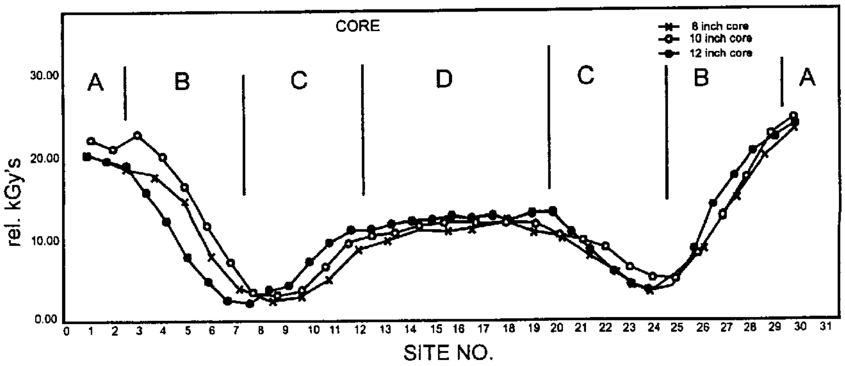
Figure 8A:
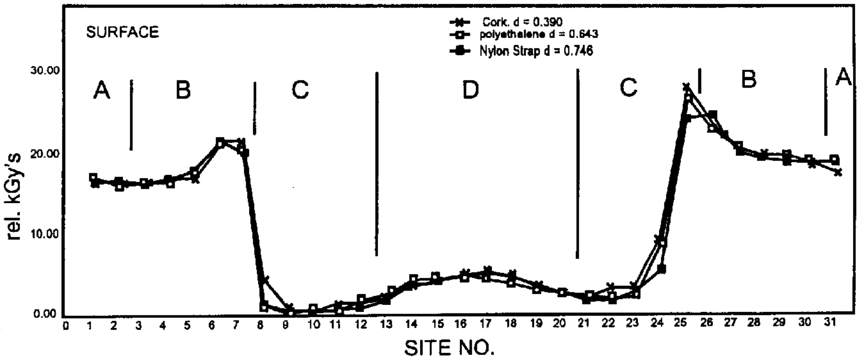
FIGS. 8A–8D plot the depth/dose profile of materials having three different densities disposed on the stationary reel of FIG. 5.
Figure 8B:
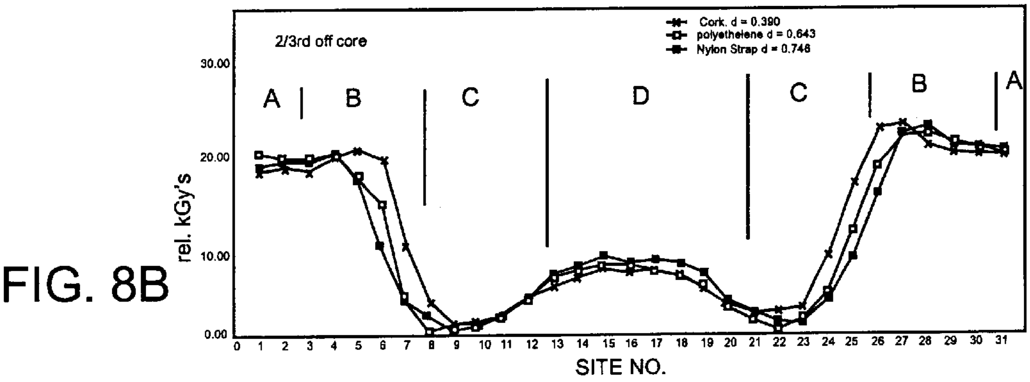
Figure 8C:
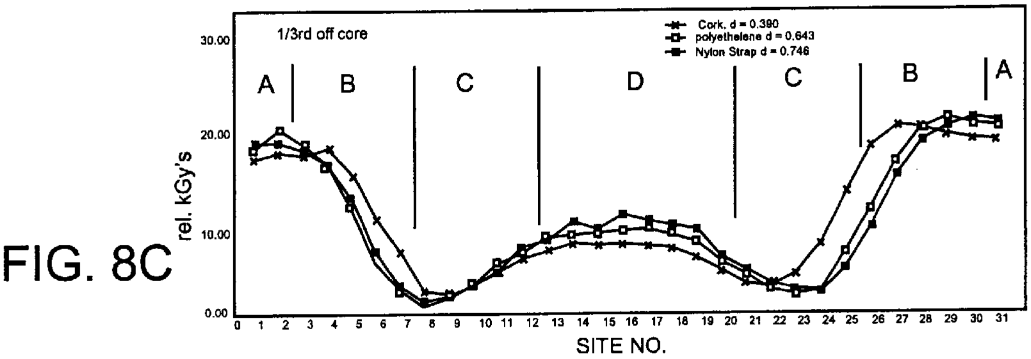
Figure 8D:
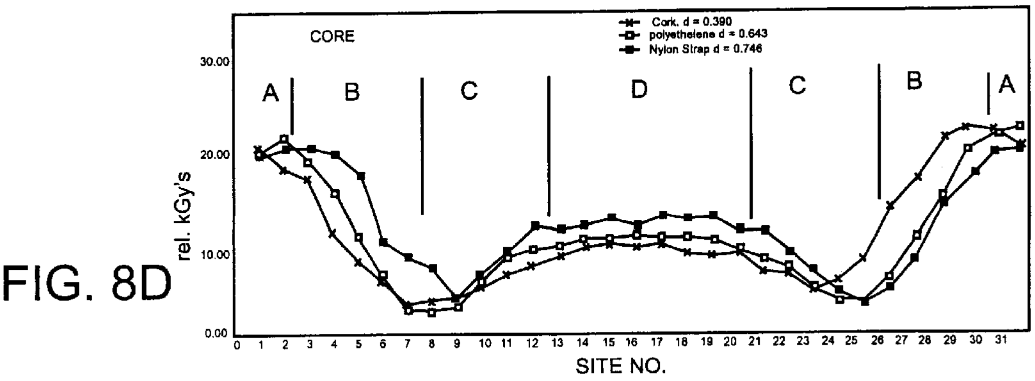

The depth/dose profiles plotted in FIGS. 6A–6D generally confirm the conventional dopant profile shown in FIG. 1. For example, the electron dose received in frontside surface portions directly in the beam path (FIG. 6A, Region A-sites 1, 2, and 31) is generally lower than the electron dose received in subsurface portions in the same region (FIGS. 6B–6D, Region A-sites 1, 2, and 31). Moreover, the highest doses in Region A appear at intermediate depths (FIGS. 6B–6C, Region A-sites 1, 2, and 31).

Where the irradiated material curves away from the beam, a spike in dosage in surface portions is observed. (FIG. 6A, Region B-sites 7 and 26). This dosing behavior likely attributable to intervening target material causing the "surface" regions to actually receive "subsurface" type doses.

As stated above, irradiation of target material on the backside of the reel is critical to achieving a constant depth/dose profile in accordance with the present invention. For target material positioned on the backside of the reel, surface portions (FIG. 6A, Region D-sites 12–21) receive a lower dose than portions at the core (FIGS. 6B–6D, Region D-sites 12–21). This is likely attributable to the shadowing effect of target material intervening between the beam and the surface of target material on the backside of the reel.

The increased dose observed at the backside surface with a thinner target material further supports this view, as there is significantly less intervening target material. (Compare FIG. 6A, Region D-sites 12–21, for 0.507" thick material versus 1.014" thick material and 1.482" thick material).

Further consistent with this theory, the shadowing effect diminished with material closer to the core on the reel backside, due to the presence of less intervening target material. (Compare FIGS. 6A–6B, Region D-sites 12–21, with FIG. 6D, Region D-sites 12–21). Thus, from FIGS. 6A–6D it is seen that the thickness of the target material can significantly affect the depth/dose profile.

FIGS. 7A–7D plot the effect upon the depth/dose profile for target material disposed about stationary reels having three different core diameters. FIGS. 7A–7D also shows that the size of the core diameter affects the dosage received at various regions of the target material.

Figure 9A:
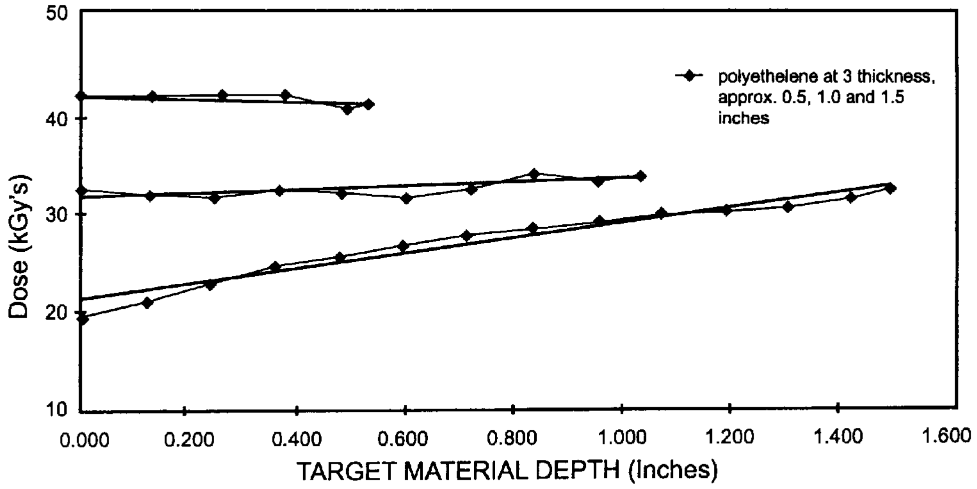
FIG. 9A plots depth/dose profiles for three thicknesses of polyethylene material positioned on a rotating 10" reel.

An additional parameter affecting the depth/dose profile is the density of the irradiated material. FIGS. 8A–8D plot the effect upon dose for target materials of different densities disposed around the stationary reel of FIG. 5. FIGS. 8A–8D reveal that the density of the target material will also affect the dose of radiation received.

Where a reel having a low density core is rotated within the electron beam, a substantially linear depth/dose profile will result. FIG. 9A plots the depth/dose profile for three thicknesses of polyethylene material positioned on a rotating reel having a 10" diameter core. All three samples show a substantially linear depth/dose relationship. Moreover, the sample of intermediate thickness (1") evidences a substantially constant depth/dose relationship.

Figure 9B:
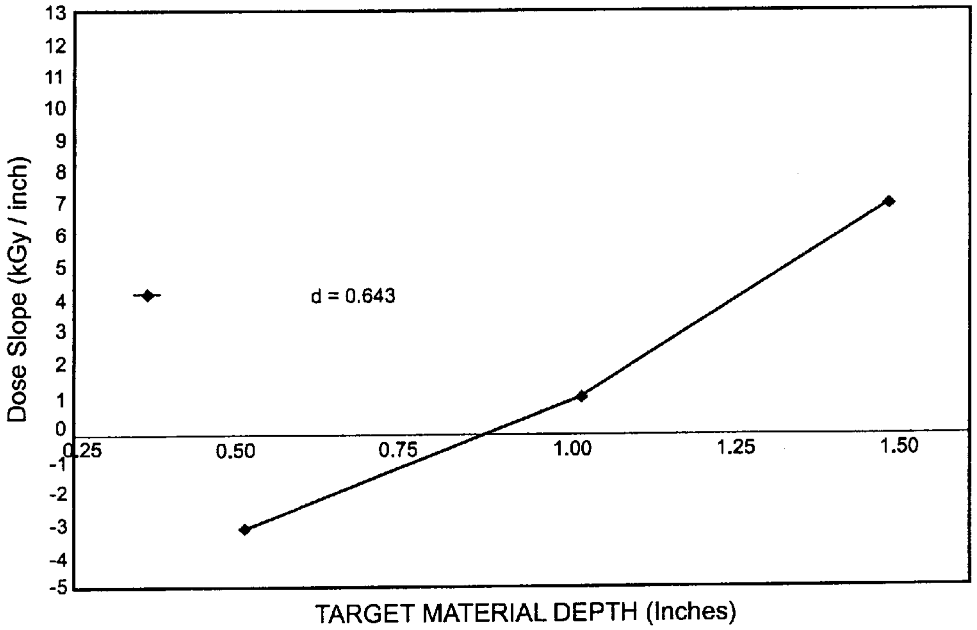
FIG. 9B plots dose slope vs. target material depth for the three samples shown in FIG. 9A.

FIG. 9B plots the slope of the linear depth/dose profiles shown in FIG. 9A, versus depth into the target material. FIG. 9B indicates that polyethylene material having a thickness of about 1" disposed around a 10" diameter core should exhibit a constant (slope=0) depth/dose profile.

Figure 10A:
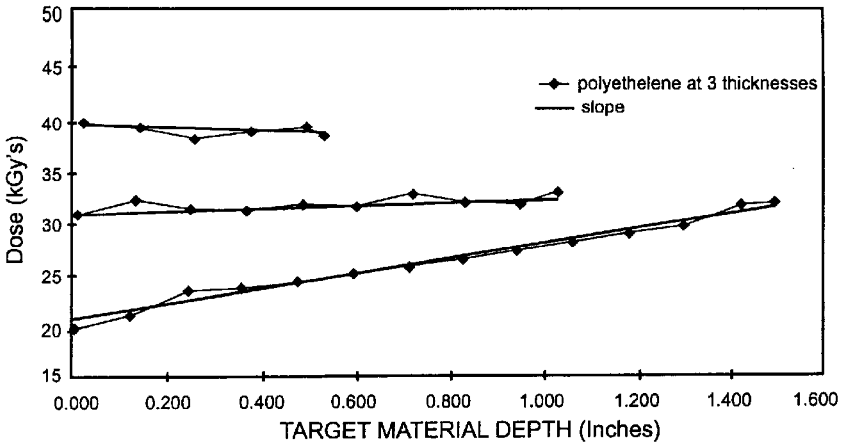
FIG. 10A plots depth/dose profiles for three thicknesses of polyethylene material positioned on a rotating 8" reel.
Figure 10B:
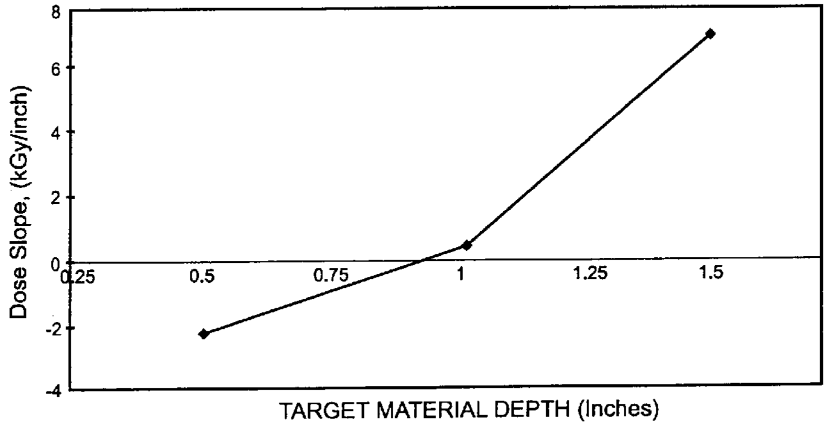
FIG. 10B plots dose slope vs. target material depth for the three samples shown in FIG. 10A.

The reproducibility of this result was confirmed by performing the same experiment using a reel having a different diameter core. FIG. 10A plots the depth/dose profile for three samples of polyethylene material of varying thickness positioned on a rotating 8" reel. FIG. 10B plots the dose slope versus material thickness for the samples shown in FIG. 10A.

Figure 10C:
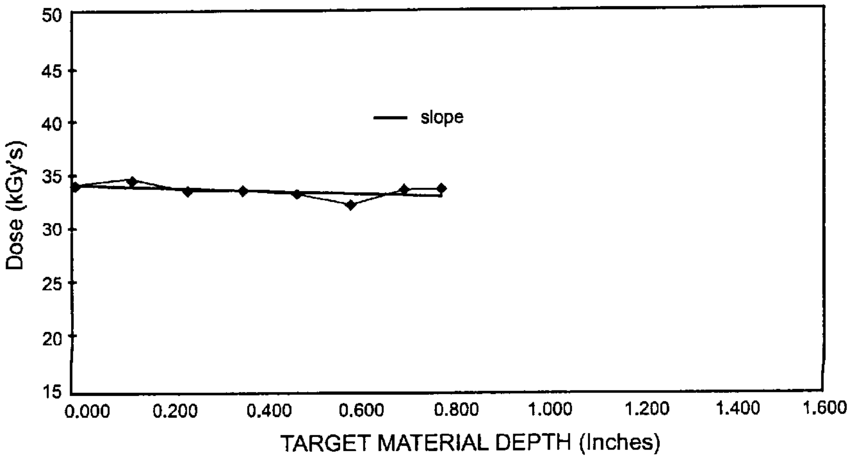
FIG. 10C plots the depth/dose profile of polyethylene material having a thickness predicted from FIG. 10B to yield a constant depth/dose profile.

Again, all three samples exhibit a substantially linear depth/dose profile. Moreover, based upon the slopes of the depth/dose curves of the 0.5", 1", and 1.5" thick samples, FIG. 10B predicted that a constant depth/dose should be obtained by a polyethylene material having a thickness between 0.5" and 1.0". This was confirmed by experimentation, as FIG. 10C shows that polyethylene material having a thickness of approximately 0.780" produced a substantially constant depth/dose profile having a slope of −2.2 kGy/inch.

To explore the effect of target material density upon irradiation in accordance with the present invention, the experiments described above in FIGS. 9A–9B were repeated using target material made of cork having a significantly lower density (0.390 g/cm$^3$) than polyethylene material (0.643 g/cm$^3$).

Figure 11A:
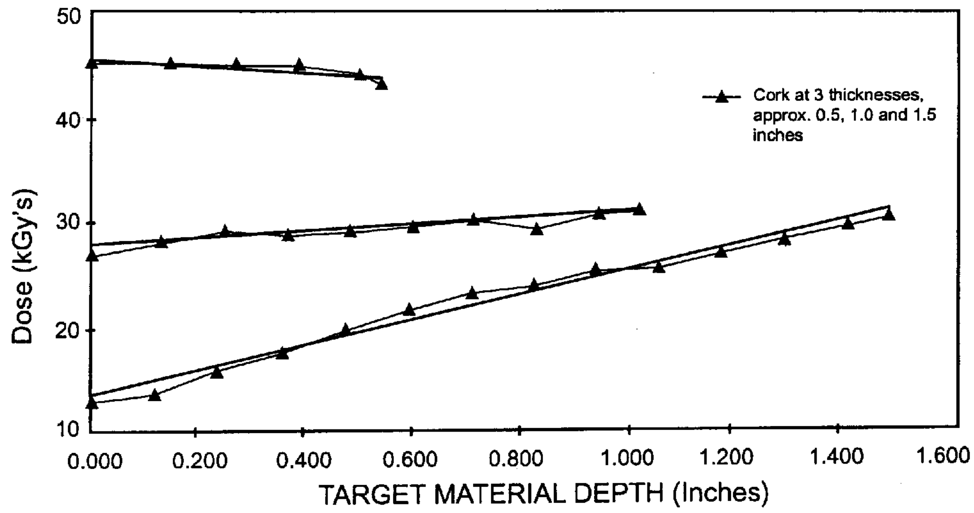
FIG. 11A plots depth/dose profiles for three thicknesses of cork positioned on a rotating 10" reel.

FIG. 11A plots the depth/dose profile for three thicknesses of cork material positioned on a rotating 10" reel. All three samples show a substantially linear depth/dose profile. Moreover, the sample of least (0.5") thickness evidences a substantially constant depth/dose relationship.

Figure 11B:
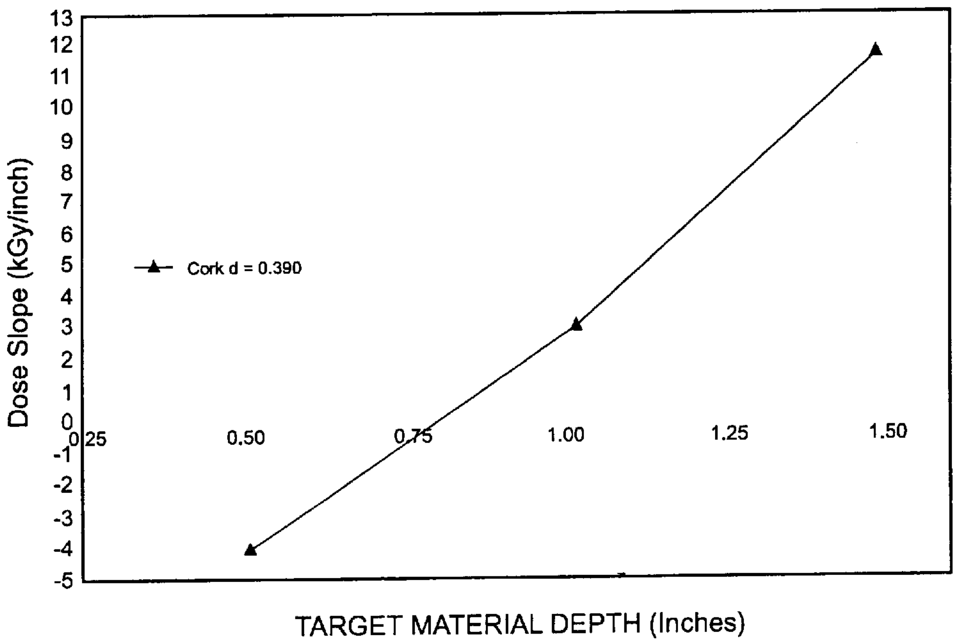
FIG. 11B plots dose slope vs. target material depth for the three cork samples shown in FIG. 11A.

FIG. 11B plots the dose slope versus target material depth of the linear depth/dose curves shown in FIG. 11A. FIG. 11B indicates that polyethylene material having a thickness of about 0.79" disposed around a 10" reel will exhibit a constant (slope=0) depth/dose profile.

Figure 12A:
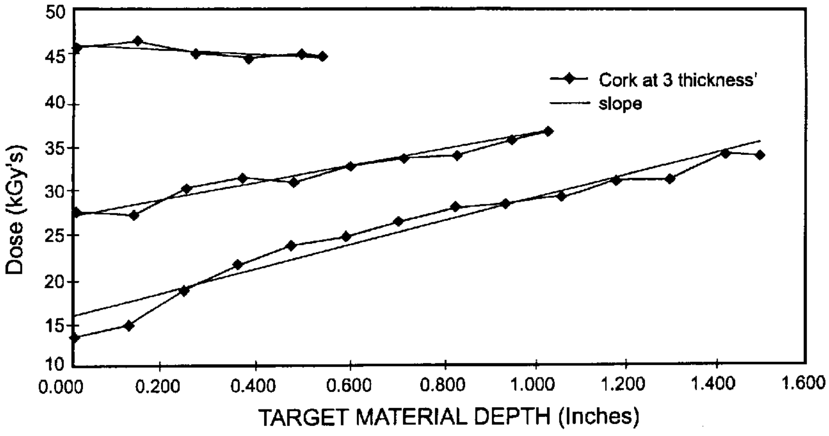
FIG. 12A plots depth/dose profiles for three thicknesses of cork material positioned on a rotating 8" reel.
Figure 12B:
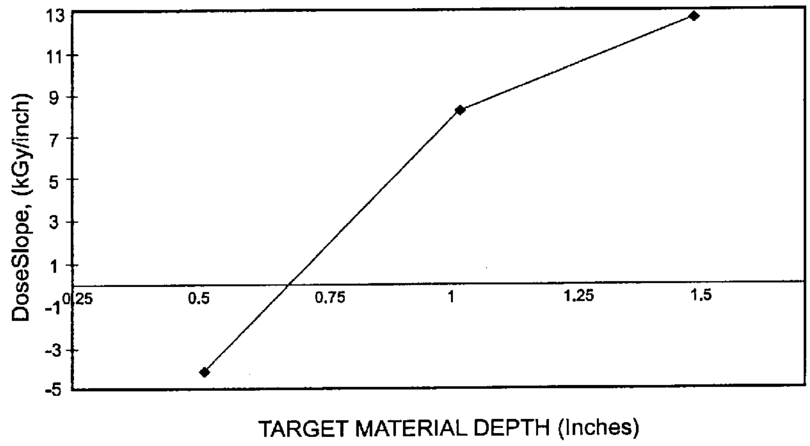
FIG. 12B plots dose slope vs. target material depth for the three samples shown in FIG. 12A.

The reproducibility of this result was confirmed by performing the same experiment using a reel with a different diameter core. FIG. 12A plots the depth/dose profile for three thicknesses of cork material positioned on a rotating 8" reel. FIG. 12B plots dose slope versus target material depth for the cork samples shown in FIG. 12A.

Figure 12C:
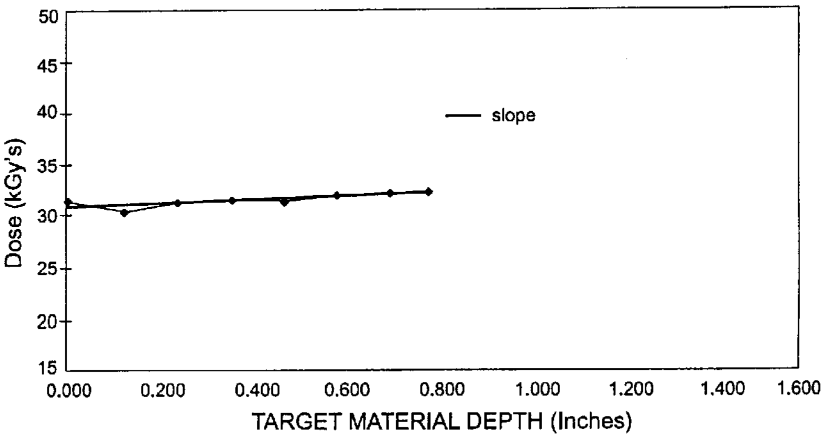
FIG. 12C plots the depth/dose profile of cork material having a thickness predicted from FIG. 12B to yield a constant depth/dose profile.

Again, all three samples exhibit a substantially linear depth/dose relationship. Moreover, based upon the slopes of the depth/dose curves of the 0.5", 1", and 1.5" samples, FIG. 12B predicted that a constant depth/dose should be obtained by a cork material having a thickness between 0.5" and 1" disposed around an 8" core. This was also confirmed by experimentation, as FIG. 12C shows that cork material having a thickness of approximately 0.78" produced a substantially constant depth/dose profile having a slope of 1.1 kGy/inch.

To further explore the effect of target material density upon irradiation in accordance with the present invention, the experiments described above in FIGS. 9A–9B and 11A–11B were repeated using target material made of nylon strap material having a significantly higher density (0.746 g/cm$^3$) than either polyethylene (0.643 g/cm$^3$) or cork (0.390 g/cm$^3$).

Figure 13A:
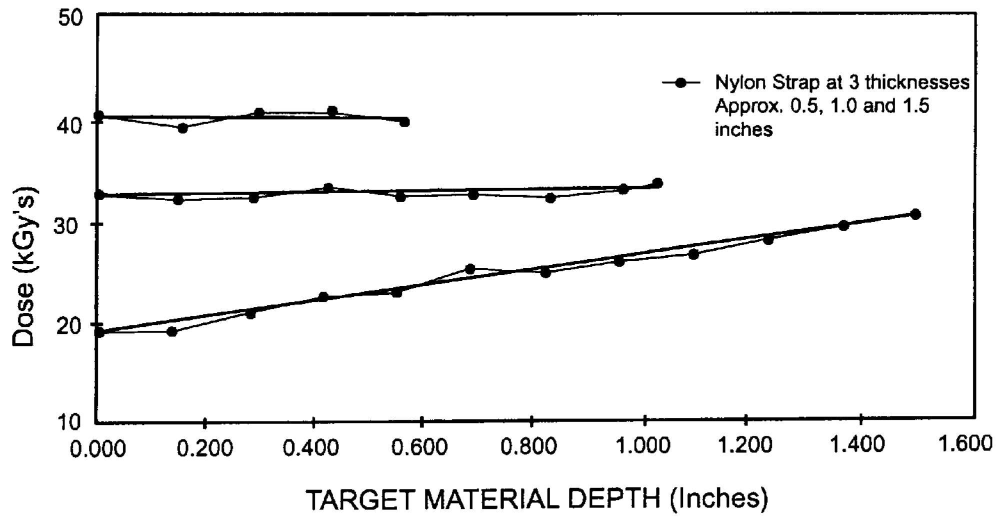
FIG. 13A plots depth/dose profiles for three thicknesses of nylon strap material positioned on a rotating 10" reel.

FIG. 13A plots the depth/dose profile for three thicknesses of nylon strap material positioned on a rotating reel having a 10" core. All three samples show a substantially linear depth/dose relationship. Moreover, the sample of least (0.5") thickness evidenced a constant depth/dose relationship.

Figure 13B:
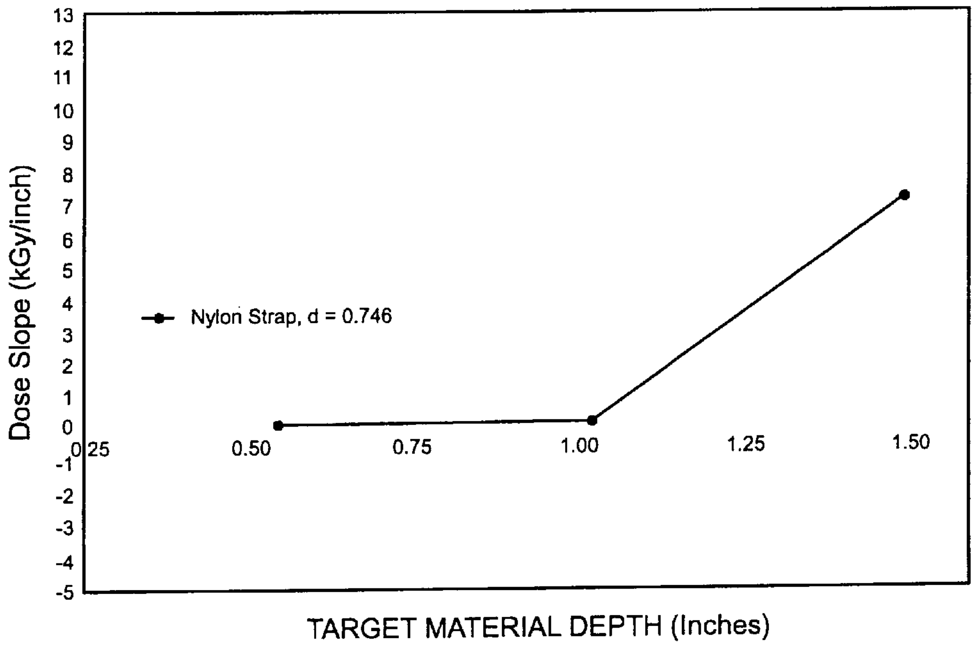
FIG. 13B plots the dose slope vs. target material depth for the three nylon strap samples shown in FIG. 13A.

FIG. 13B plots the dose slope versus material thickness for the three nylon strap samples shown in FIG. 13A. FIG. 13B indicates that nylon strap material having a thickness of about 0.5" that is disposed around a 10" core will exhibit a constant (slope=0) depth/dose relationship.

Figure 14A:
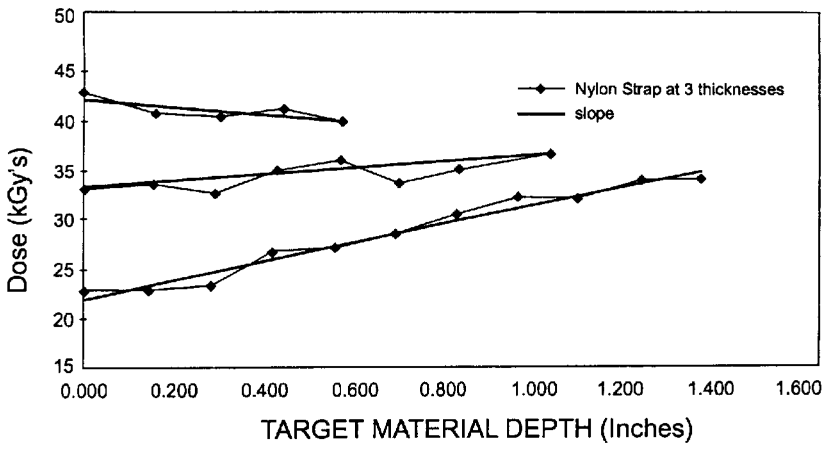
FIG. 14A plots depth/dose profiles for three thicknesses of nylon strap material positioned on a rotating 8" reel.
Figure 14B:
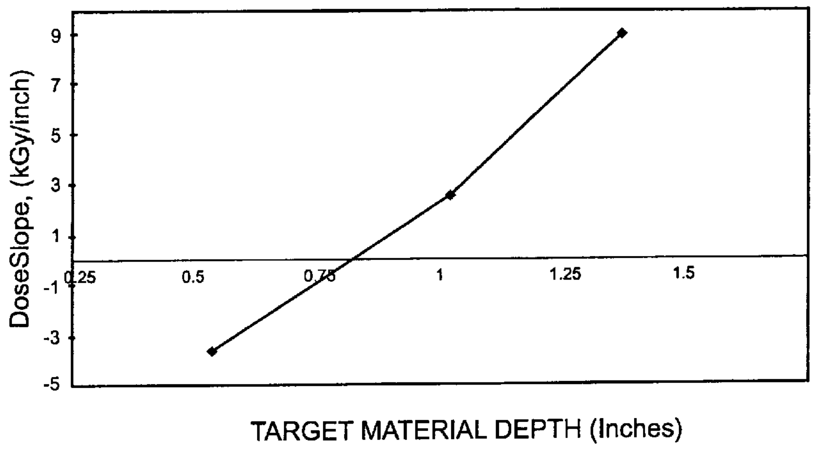
FIG. 14B plots dose slope vs. target material depth for the three samples shown in FIG. 14A.

The reproducibility of this result was confirmed by performing the same experiment using a reel having a different diameter. FIG. 14A plots the depth/dose profile versus depth for three thicknesses of nylon strap material positioned on a rotating real having an 8" core. FIG. 14B plots the dose slope versus material thickness for the nylon strap samples shown in FIG. 14A.

Figure 14C:
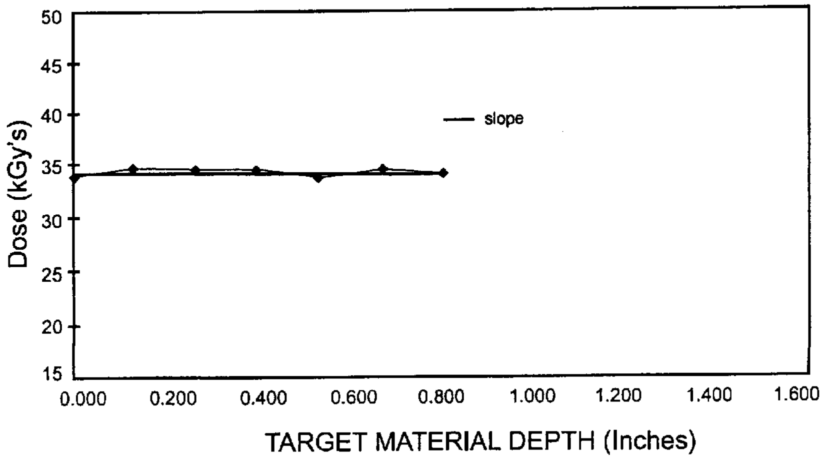
FIG. 14C plots the depth/dose profile of nylon strap material having a thickness predicted from FIG. 14B to yield a constant depth/dose profile.

Again, all three samples exhibit a substantially linear depth/dose relationship. Moreover, based upon the slopes of the depth/dose curves of the 0.5", 1.0", and 1.5" samples, FIG. 14B predicted that a constant depth/dose should be obtained by a polyethylene material having a thickness of between 0.5" and 1.0" disposed around an 8" core. This was also confirmed by experimentation, as FIG. 14C shows that nylon strap material having a thickness of approximately 0.816" produced a substantially constant depth/dose profile having a slope of 0.84 kGy/inch.

Orientation of direction of rotation of the reel relative to the direction of beam sweep plays a critical role in performing the process for irradiation in accordance with the present invention. In order for the present method to function, the axis of rotation of the reel must be substantially perpendicular to the direction of beam sweep.

Figure 15:
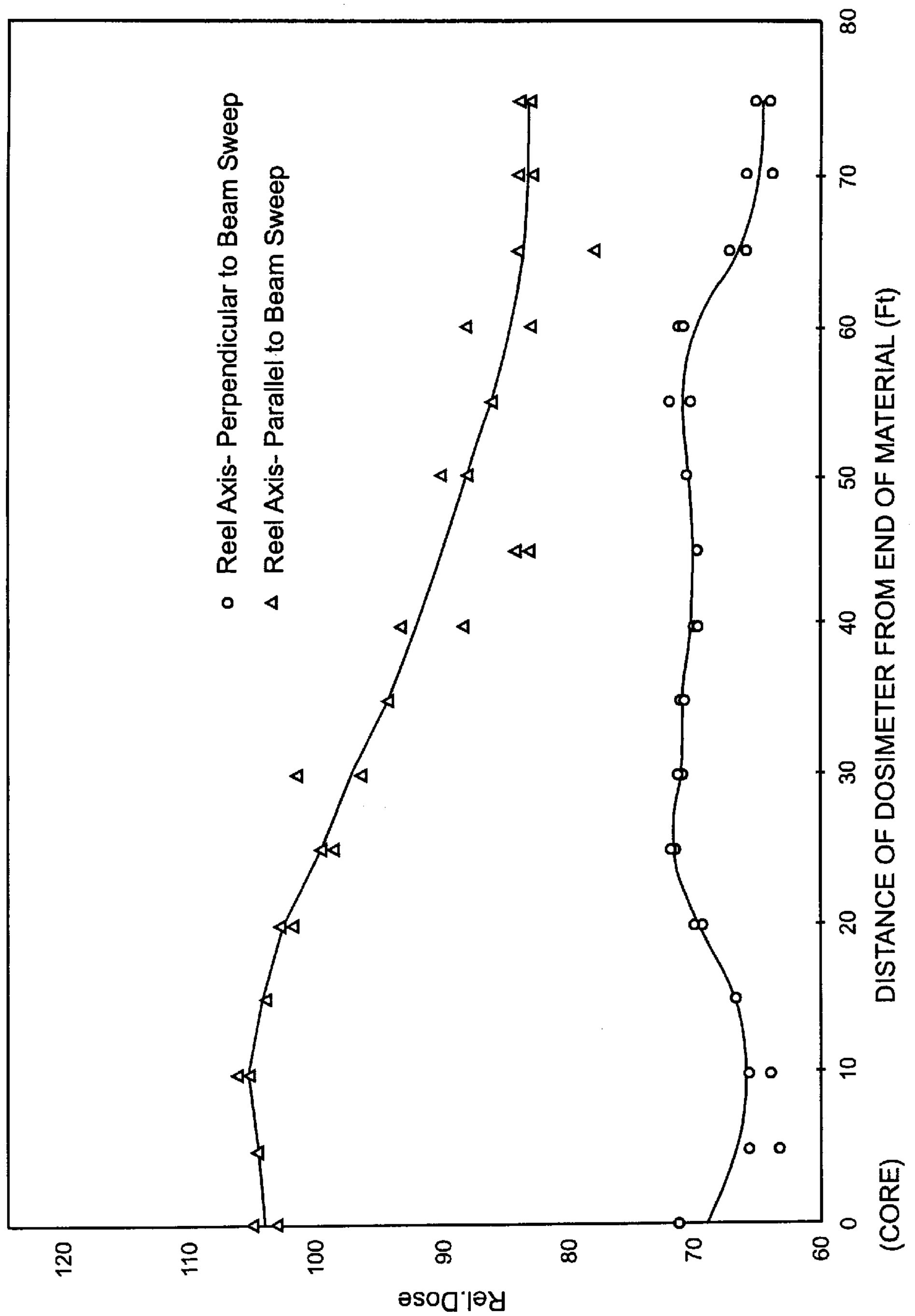
FIG. 15 shows the result of irradiating 75 ft of polyethylene material wrapped around a 22" rotating core, with the polyethylene material having dosimeters positioned every 5 ft.

This is illustrated in FIG. 15, which shows the result of irradiating 75 ft of polyethylene material wrapped around a 22" rotating core, with the polyethylene material having dosimeters positioned every 5 ft. Irradiation of the reel having an axis of rotation perpendicular to the beam sweep yielded relatively constant dosing throughout the sample: the maximum dose differed from the surface dose by about 12.3% (73−65=8; 8/65×100=12.3%). By contrast, irradiation of the reel under the same conditions, except with the axis of rotation parallel to the beam sweep, yielded a much wider range of dosing throughout the sample (106−84=22; 22/84×100=26.2%).

This variation is probably attributable to the fact that where the axis of rotation of the reel is parallel to the beam sweep, target material located at the periphery of the beam sweep receives a lower dose of radiation than target material located at the center of the beam sweep. Thus, the lack of constant dosing evidenced by the triangles in FIG. 15 is likely the result of the orientation of the beam sweep relative to the axis of rotation.

Irradiation of target material in accordance with the present invention offers a number of important advantages over conventional methods. Most importantly, irradiation in accordance with the present invention results in the target material having a substantially constant dose of radiation extending into a depth of the material. The permissible amount of variation in dose will vary with the particular application. In general however, irradiation in accordance with the present invention achieves a depth/dose profile whose maximum subsurface dose varies by 10% or less from the surface dose.

Irradiation in accordance with the present invention is particularly suited for sterilization applications in which traditional processes of irradiation could generate unwanted heat. Thus, where heat-sensitive material such as plastic is being exposed to radiation under tension between two spools, conventional irradiation could cause heating of the plastic, resulting in stretching or even fracture of the tubing. The constant dosing provided by the present invention eliminates this problem.

Other advantages of the present invention include reduced power consumption, and, in cross-linking applications, a greater degree of control over the polymerization reaction throughout the thickness of the target material.

Although the invention has been described in connection with one specific preferred embodiment, it must be understood that the invention as claimed should not be limited to such specific embodiments. Various other modifications and alterations in the method of operation of this invention will be apparent to those skilled in the art without departing from the scope of the present invention.

For example, the experimental examples provided above describe the result of electron beam irradiation in which 1) target material thickness, 2) reel core diameter, and 3) target material density were varied, with the energy of the electron beam maintained constant (at 6 MeV). However, it is also possible to vary other irradiation parameters in order to affect the depth/dose profile.

For example, it may be possible to vary the energy of the electron beam in order to ensure constant a constant depth/dose profile. Variation of this parameter is particularly important where cumulative radiation exposures will be employed to avoid the heat associated with a single heavy exposure.

Moreover, it may also be possible to vary the speed of rotation of the target material within the radiation beam in order to ensure constant dosing. The speed of rotation of the reel must create sufficient exposure at different points on the reel during the irradiation process, in order to harmonize or normalize the dose received by the target material.

Certain practical realities may dictate which irradiation parameters can be varied to produce the desired constant depth/dose profile. For example, in many electron beam irradiation devices, the energy of the beam is fixed, and a change of the beam's energy requires calibration and adjustment. Moreover, the density of the target will be dictated by the target material chosen for irradiation. Finally, the core diameter may be determined by the reel apparatus employed in a particular laboratory or industrial setting. Therefore, one likely procedure for producing a constant depth/dose profile in an irradiated target material would be to maintain a constant core diameter and electron energy, while varying the thickness of the target material.

While the above discussion includes experimental examples involving exposing a target material to electron beam irradiation, the present invention is not limited to this form of irradiation. Other forms of radiation, such as X-ray and gamma radiation, could also be utilized in the present method to produce a constant depth/dose profile.

The physical mechanism giving rise to the constant depth/dose profile of the present invention is not yet completely understood. It is possible that rotating the target in front of the beam continuously shifts the position of each point of the irradiated material relative to the beam, thereby distributing electron dose throughout the various depths of the target material. For example, with reference to FIG. 5, if the reel is rotated relative to the beam, at a first point in time the surface dosimeter at site 1 will receive a typical surface dose. However, after rotation of the reel ¼ turn, this same dosimeter will be positioned at a different, "subsurface" location relative to the electron beam.

Figure 16:
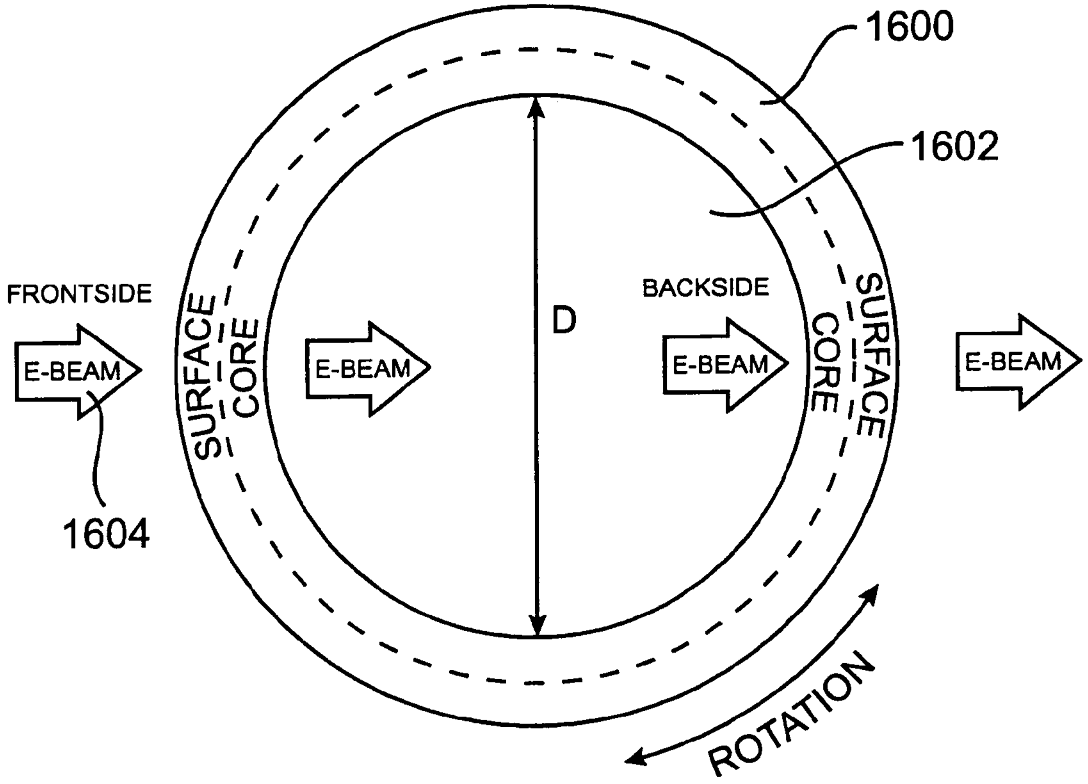
FIG. 16 shows a cross-sectional view of target material positioned on a reel and placed in a beam of electron radiation in accordance with the present invention.

Moreover, by reducing the density of the core, it is possible to ensure further homogenization of dosing. Thus, again considering the reel shown in FIG. 5 rotating in the electron beam, at a first point in time the surface dosimeter at site 1 will receive a "surface" type dose. However, once the reel has rotated ½ turn, this dosimeter will be positioned at a polar opposite position (site 16) relative to the beam, such that the "surface" of the target material will receive a "core" type dose. This is shown in FIG. 16, where target material 1600 disposed around core 1602 having diameter D is rotated in the path of electron beam 1604. Averaging the total dose received by the target material over time would produce a constant depth/dose profile.

Given the specific embodiments of the present invention described above, it is intended that the following claims define the scope of the present invention, and that the methods and structures within the scope of these claims and their equivalents be covered hereby.

What is claimed is:

1. A process of irradiation comprising the steps of:

providing a beam of radiation having an energy and a direction of scan sweep;

providing a reel having a center axis, the reel including a core substantially transparent to the beam of radiation;

disposing around the reel a target material having a thickness;

rotating the reel around the center axis; and directing the beam at the target material such that the direction of scan sweep is substantially perpendicular to the center axis, whereby the beam of radiation encounters the target material on a frontside of the reel, passes through the core, and reencounters target material on a backside of the reel such that the target material receives a substantially constant dose of radiation throughout its thickness.

2. The process according to claim 1 wherein the substantially constant dose of radiation is such that the highest dose of radiation received by the target material is 10% or less of a dose of radiation received at a surface of the target material.

3. The process of irradiation according to claim 1 wherein the beam of radiation is x-ray radiation.

4. The process of irradiation according to claim 1 wherein the beam of radiation is gamma radiation.

5. The process of irradiation according to claim 1 wherein the beam of radiation is electron beam radiation.

6. A method of optimizing an irradiation process in which a target material is rotated at a speed on a core substantially transparent to a beam of radiation, the method comprising the steps of:

maintaining constant the speed of rotation, an energy of the radiation beam, a density of the target material, and a diameter of the core; and varying a thickness of the target material to produce a substantially constant dose of radiation throughout the thickness of the target material.

7. The method according to claim 6 wherein the substantially constant dose of radiation is such that the highest dose of radiation received by the target material is 10% or less of a dose of radiation received at a surface of the target material.

8. The method according to claim 6 wherein the beam of radiation is x-ray radiation.

9. The method according to claim 6 wherein the beam of radiation is gamma radiation.

10. The method according to claim 6 wherein the beam of radiation is an electron beam.

11. A method of optimizing an irradiation process in which a target material is rotated at a speed on a core substantially transparent to a beam of radiation, the method comprising the steps of:

maintaining constant the speed of rotation, an energy of the radiation beam, a density of the target material, and a thickness of the target material; and varying a diameter of the core to produce a substantially constant dose of radiation throughout the thickness of the target material.

12. The method according to claim 11 wherein the substantially constant dose of radiation is such that the highest dose of radiation received by the target material is 10% or less of a dose of radiation received at a surface of the target material.

13. The method according to claim 11 wherein the beam of radiation is x-ray radiation.

14. The method according to claim 11 wherein the beam of radiation is gamma radiation.

15. The method according to claim 11 wherein the beam of radiation is an electron beam.

16. A method of optimizing an irradiation process in which a target material is rotated at a speed on a core substantially transparent to a beam of radiation, the method comprising the steps of:

maintaining constant the speed of rotation, a diameter of the core, a density of the target material, and a thickness of the target material; and varying an energy of the radiation beam to produce a substantially constant dose of radiation throughout the thickness of the target material.

17. The method according to claim 16 wherein the substantially constant dose of radiation is such that the highest dose of radiation received by the target material is 10% or less of a dose of radiation received at a surface of the target material.

18. The method according to claim 16 wherein the beam of radiation is x-ray radiation.

19. The method according to claim 16 wherein the beam of radiation is gamma radiation.

20. The method according to claim 16 wherein the beam of radiation is an electron beam.

21. A method of optimizing an irradiation process in which a target material is rotated at a speed on a core substantially transparent to a beam of radiation, the method comprising the steps of:

maintaining constant a diameter of the core, a density of the target material, a thickness of the target material, and the energy of the radiation beam; and varying the speed of rotation to produce a substantially constant dose of radiation throughout the thickness of the target material.

22. The method according to claim 21 wherein the substantially constant dose of radiation is such that the highest dose of radiation received by the target material is 10% or less of a dose of radiation received at a surface of the target material.

23. The method according to claim 21 wherein the beam of radiation is x-ray radiation.

24. The method according to claim 21 wherein the beam of radiation is gamma radiation.

25. The method according to claim 21 wherein the beam of radiation is an electron beam.

26. An apparatus for irradiating a target material comprising:

an radiation source producing a beam of radiation having a scan direction;

a cylindrical reel having a core and a central axis, the core composed of material substantially transparent to the beam of radiation, the central axis substantially perpendicular to the scan direction, and the reel rotatable about the central axis; and a target material disposed around the cylindrical reel.

27. The apparatus according to claim 26 wherein the source produces a beam of x-ray radiation.

28. The apparatus according to claim 26 wherein the source produces a beam of gamma radiation.

29. The apparatus according to claim 26 wherein the source produces an electron beam.

* * * * *